United States Patent
Muraki et al.

(10) Patent No.: US 6,580,936 B2
(45) Date of Patent: Jun. 17, 2003

(54) COLORING METHOD AND APPARATUS FOR MULTICHANNEL MRI IMAGING PROCESS

(75) Inventors: Shigeru Muraki, 2-711-1303, Azuma, Tsukuba-shi, Ibaraki 305-0031 (JP); Toshiharu Nakai, 3-4-8-236, Satsukigaoka, Ikeda-shi, Osaka 563-0029 (JP)

(73) Assignees: National Institute of Advanced Industrial Science and Technology, Tokyo (JP); Shigeru Muraki, Ibaraki (JP); Toshiharu Nakai, Osaka (JP)

( * ) Notice: Subject to any disclaimer, the term of this patent is extended or adjusted under 35 U.S.C. 154(b) by 173 days.

(21) Appl. No.: 09/750,989

(22) Filed: Dec. 28, 2000

(65) Prior Publication Data

US 2001/0021794 A1 Sep. 13, 2001

(30) Foreign Application Priority Data

Mar. 6, 2000 (JP) ........................ 2000-061244

(51) Int. Cl.$^7$ ............................ A61B 5/055; G06F 3/14
(52) U.S. Cl. ........................ 600/410; 382/128; 345/424
(58) Field of Search ........................ 600/410; 382/128; 324/307, 309; 345/424

(56) References Cited

U.S. PATENT DOCUMENTS

| | | | | |
|---|---|---|---|---|
| 4,609,872 A | * | 9/1986 | O'Donnell | 324/306 |
| 4,728,892 A | * | 3/1988 | Vinegar et al. | 324/309 |
| 6,008,813 A | * | 12/1999 | Lauer et al. | 345/424 |
| 6,243,098 B1 | * | 6/2001 | Lauer et al. | 345/424 |
| 2001/0031920 A1 | * | 10/2001 | Kaufman et al. | 600/431 |
| 2002/0045153 A1 | * | 4/2002 | Kaufman et al. | 434/262 |
| 2002/0113787 A1 | * | 8/2002 | Ray et al. | 345/424 |

* cited by examiner

Primary Examiner—Joseph Pelham
(74) Attorney, Agent, or Firm—Cohen, Pontani, Lieberman & Pavane

(57) ABSTRACT

The present invention scanes a plurality of MRI images while varying conditions for a sample usable in color-determination and MRI imaging, subjects the image data to a first independent component analysis to decompose the data into L independent component images, selects N points on the sample to create a training sample that is a set of L (typically three) independent-component image luminances and color components. This generates as many transfer functions as the color components which output one color component for an arbitrary combination of the L independent-component image luminances. For a colored MRI generating object a plurality of MRI images are scanned while varying conditions, and a second independent component analysis on the MRI images accomplishes generating L independent component images. A calibration process scaling luminance is executed and the transfer functions are applied to the calibrated independent component images to obtain a multichannel MRI color image.

2 Claims, 11 Drawing Sheets

(6 of 11 Drawing Sheet(s) Filed in Color)

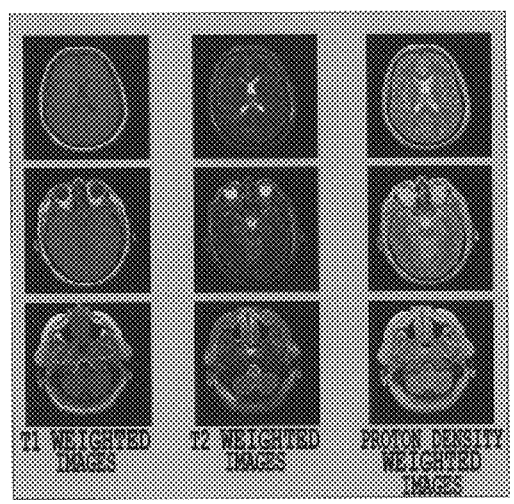
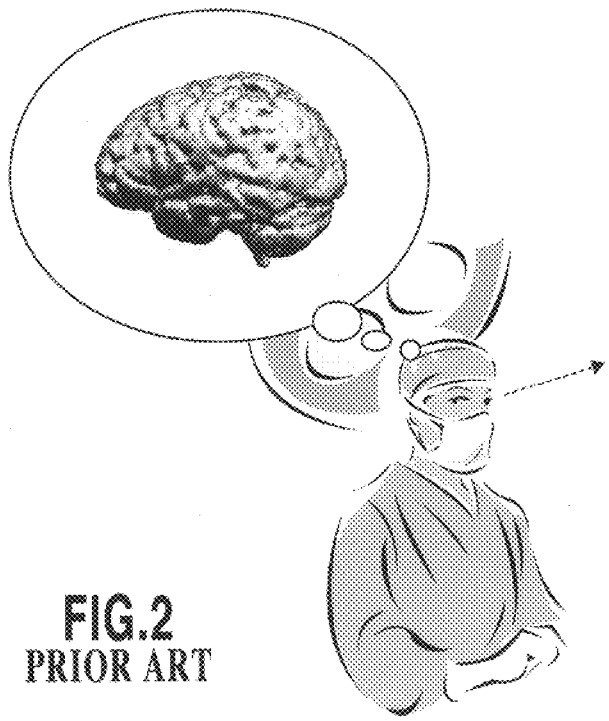
FIG.2
PRIOR ART

TRAINING SAMPLE

| | INDEPENDENT COMPONENTS | COLOR |
|---|---|---|
| 1 | $S_{1,1}, S_{1,2}, \ldots, S_{1,L}$ | $R_1, G_1, B_1$ |
| 2 | $S_{2,1}, S_{2,2}, \ldots, S_{2,L}$ | $R_2, G_2, B_2$ |
| . | . | . |
| . | . | . |
| . | . | . |
| N | $S_{N,1}, S_{N,2}, \ldots, S_{N,L}$ | $R_N, G_N, B_N$ |

FIG.5

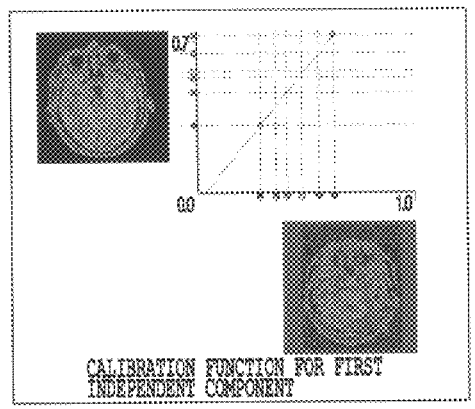
FIG.8A CALIBRATION FUNCTION FOR FIRST INDEPENDENT COMPONENT
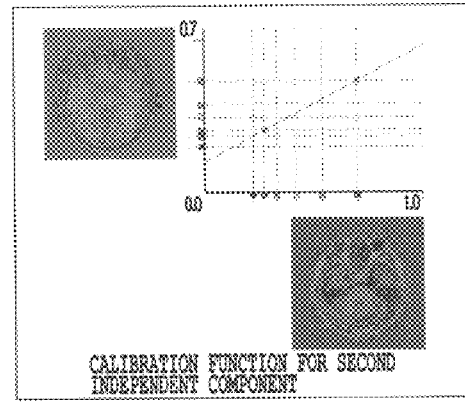
FIG.8B CALIBRATION FUNCTION FOR SECOND INDEPENDENT COMPONENT
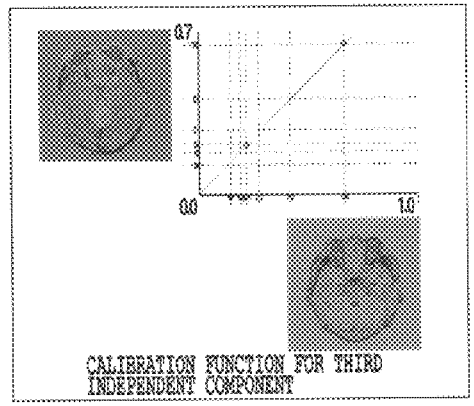
FIG.8C CALIBRATION FUNCTION FOR THIRD INDEPENDENT COMPONENT

COLORING METHOD AND APPARATUS FOR MULTICHANNEL MRI IMAGING PROCESS

This application is based on Japanese Patent Application No. 2000-61244 filed Mar. 6, 2000, the content of which is incorporated hereinto by reference.

BACKGROUND OF THE INVENTION

Field of the Invention

The present invention relates to a coloring method and apparatus for multichannel MRI imaging process that generates a color image from multichannel MRI images.

Medical image diagnosis apparatuses based on CT (Computer Tomography) or MRI (Magnetic Resonance Imaging) can measure the three-dimensional form of a living body at an accuracy in the order of millimeters. Luminance information in these images appropriately reflects differences among living tissues. In the CT, the luminance information indicates an absorption coefficient for X rays, while in the MRI, it indicates amounts relating to magnetic relaxation time for nuclear spin. In particular, the MRI luminance information shows various contrasts depending on how radio pulses are applied during imaging and is thus effective on the diagnosis of living tissues. Images such as T1 (vertical relaxation time) weighted images, T2 (horizontal relaxation time) weighted images, or proton density weighted images which are often scanned in clinical fields are distinguished based on the magnitude of the repetition time (TR) or echo time (TE) of a pulse sequence observed during MRI imaging based on the spin echo method (see FIG. 1).

The luminance information in these images is not observed only as a pure physical amount such as the spin relaxation time but as a mixture of several factors and thus varies even with a difference in magnetic field intensity among MRI apparatuses. That is, there is a rough rule of thumb that an image with a higher proton density is obtained by increasing the repetition time TR while reducing the echo time TE, but the TR or TE value for diagnosis is not strictly determined. Due to the time required for imaging, the types of images that can be used for diagnosis are naturally limited, and doctors or radiation technicians determine what images and how many types thereof will be scanned. A doctor who diagnoses a patient observes a plurality of scanned images arranged in parallel to determine the form of the subject and the state of the living tissue based on these images (see FIG. 2).

A large amount of experience and training is required for the doctor to understand information on the living tissues of the patient from plural types of medical images. Additionally, with more images or more types thereof, it is more difficult for human beings to image the state of an object, so computers are desirably used for assistance. The recent advanced computer graphics technology has served to spread a technique for displaying a three-dimensional shape of an object from a plurality of images (volume data) continuously scanned by slightly changing a sectional position. A representative approach is surface rendering that displays boundary surfaces of the object, but this approach may totally discard the luminance information inside the surface.

In contrast, an approach called "volume rendering" provides each voxel with a color and opacity to generate an image transmitted from an arbitrary start point so as to visualize minor differences in luminance information. Volume rendering provides voxels with colors by generating transfer functions such as those shown in FIG. 3 which provide correspondences between voxel luminances and color components (RGB or RGBA with opacity). No method for generating the transfer functions, however, has been established, and each user must empirically generate voxel colors. Thus, color images obtained are not general and cannot be applied to diagnosis or the like easily. Further, since the current coloring method is based on data with a single luminance, only one channel of information is obtained despite the coloring.

If one color image can be generated from multichannel MRI images, pieces of information that can be obtained only under individual imaging conditions can be incorporated in a single image; this image is assumed to be an effective tool for diagnosis. The MRI luminance information, however, may vary and is ambiguous as previously described, so that no definite criterion exists which states what images and how many types thereof can be used to generate color images.

As described above, the prior art has the following problems:

i. The conventional visualization technique principally displays boundaries of an object and fails to effectively use the MRI luminance information.

ii. No definite criterion exists which states what MRI images and how many types thereof can be used to generate color images from multichannel MRI images.

iii. There is no established method for generating transfer functions for assigning colors to voxels.

SUMMARY OF THE INVENTION

It is an object of the present invention to provide a coloring method and apparatus for a multichannel MRI imaging process which effectively uses MRI luminance information to color multichannel MRI in order to incorporate information that can be obtained only under individual imaging conditions, in one image, so that the image can be used as an effective tool for diagnosis.

A coloring method for a multichannel MRI imaging process according to the present invention comprises imaging a plurality of (M-channel) MRI images while varying conditions for a sample such as a tissue sample for which colors can be determined and for which MRI imaging is possible, subjecting data on the M-channel MRI images to a first independent component analysis (ICA) to decompose the images into L (L≦M) independent component images, selecting N points on the sample to create a training sample that is a set of L independent component image luminances and color components. This training sample is used to generate as many transfer functions as the color components which output one color component for an arbitrary combination of the L independent component image luminances. For an object for which colored MRI is to be generated, M'-channel (M'≧L) MRI images are scanned while varying the conditions, and the data on the M'-channel MRI images are subjected to a second independent component analysis to generate L independent component images. Then, the second independent components are each calibrated so as to equal to those of the first independent component, and the transfer functions obtained using the training sample are applied to the calibrated independent component images to obtain a color image.

Additionally, a coloring apparatus for a multichannel MRI image process comprises an MRI device, a component extracting section, a transfer function generating section, a calibration section, and a converting component section into color. The MRI device scanes a plurality of (M-channel) MRI images while varying conditions for a sample such as a tissue sample for which colors can be determined and for which MRI imaging is possible, and for an object for which colored MRI is to be generated, further images M'-channel (M'≧L) MRI images while varying the conditions. The component extracting section subjects data on the M-channel MRI images to an independent component analysis (ICA) to decompose the images into L (L≦M) independent component images, and further subjects data on M'-channel MRI images to an independent component analysis to generate L independent component images. The transfer function generating section selects N points on the sample to create a training sample that is a set of L independent component image luminances and color components, and uses this training sample to generate as many transfer functions as the color components which output one color component for an arbitrary combination of the L independent component image luminances. The calibration section selects a transfer function from the transfer functions generating section and calibrates independent components of the object to be colored so that their scale equals that for independent components of the transfer function. The converting component section into color applies the transfer functions to the calibrated independent component images to obtain a color image.

The above and other objects, effects, features, and advantages of the present invention will become more apparent from the following description of embodiments thereof taken in conjunction with the accompanying drawings.

BRIEF DESCRIPTION OF THE DRAWINGS

The file of this patent contains at least one drawing executed in color. Copies of this patent with colored drawings will be provided by the Patent and Trademark Office upon request and payment of the necessary fee.

FIG. 2 is a view useful in explaining how a doctor images a diagnosis object by viewing a plurality of medical diagnosis images;

FIG. 5 is a view useful in explaining a training sample;

FIG. 8A is a view illustrating calibration in which a healthy volunteer undergoes multichannel MRI coloring using a Visible Human Dataset as a training sample;

FIG. 8B is a view illustrating the calibration in which the healthy volunteer undergoes the multichannel MRI coloring using the Visible Human Dataset as the training sample;

FIG. 8C is a view illustrating the calibration in which the healthy volunteer undergoes the multichannel MRI coloring using the Visible Human Dataset as the training sample;

DETAILED DESCRIPTION OF PREFERRED EMBODIMENTS

Figure 1:
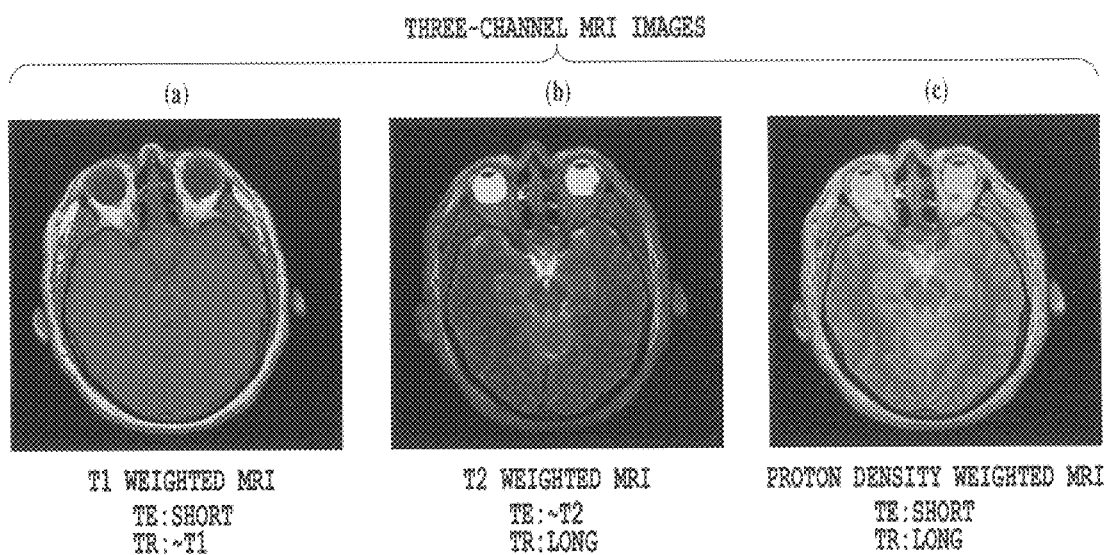
FIG. 1 is a view showing a T1 weighted image, a T2 weighted image, and a proton density weighted image which are often scanned in clinical fields.
Figure 3:
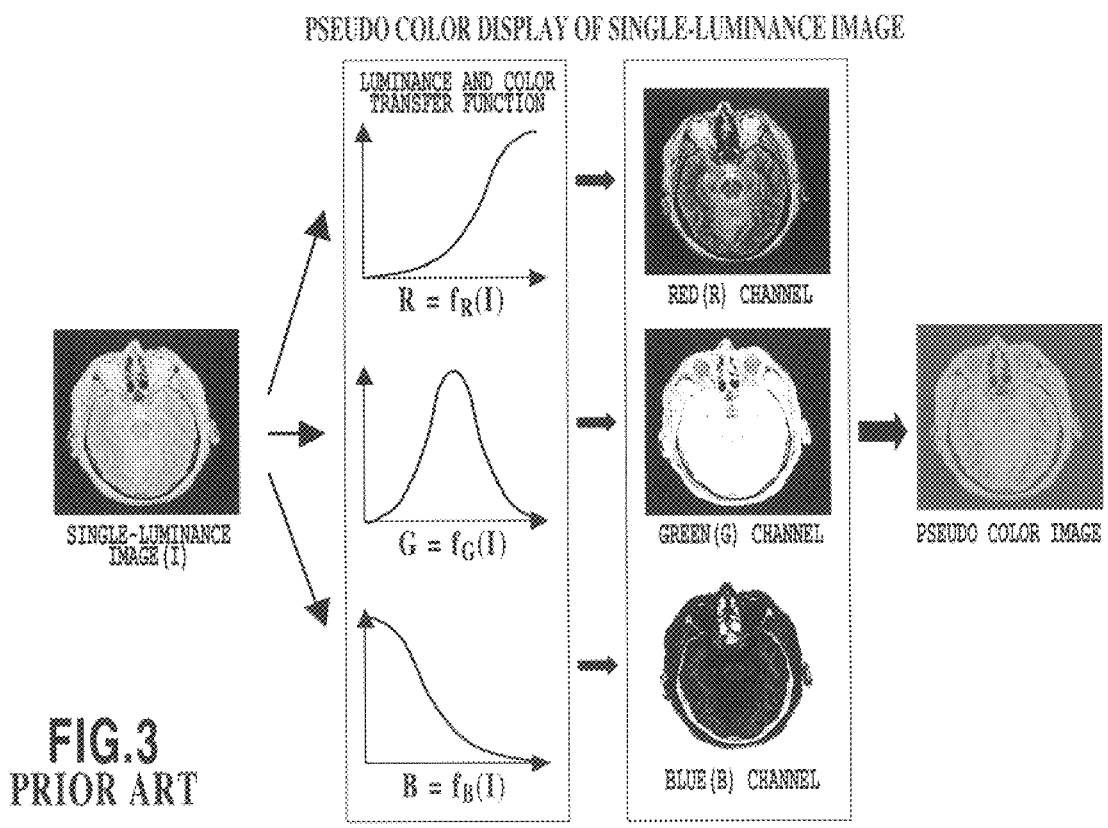
FIG. 3 is a view useful in explaining a pseudo color display of a single-luminance image.

The present invention can implement coloring of multi-channel MRI using the following stepwise process 1 to 7:

1. A plurality of (M-channel) MRI images are scanned while varying conditions for a sample such as a tissue sample for which colors can be determined and for which MRI imaging is possible.

2. The multichannel MRI images in the above 1 are subjected to a first independent component analysis (ICA) and decomposed into L (L≦M) independent component images (see FIG. 4).

For example, when three channels of MRI images (a T1 weighted image, a T2 weighted image, and a proton weighted image) undergoes the independent component analysis (ICA), the images can be decomposed into three independent component images (a relatively short relaxation time water emphasized image, a fatty-acid emphasized image, and a free-water emphasized image). In this case, M=L=3. These are assumed to be basic image components such as R (red), G (green), and B (blue) for televisions.

3. N points on the sample are selected, and a training sample that is a set of L (typically three) independent-component image luminances and color components is created (see FIG. 5).

4. This training sample is used to generate as many transfer functions as the (typically three) color components which output one color component for an arbitrary combination of the L independent-component image luminances.

If, for example, L=3, the luminance values for the three independent component images must be associated with the values of the (typically three) output color components. This association corresponds to determination of transfer functions in Equation (1) if the color components comprise three components of R, G, and B.

$$\left.\begin{array}{l} R = f1(s1, s2, s3) \\ G = f2(s1, s2, s3) \\ B = f3(s1, s2, s3) \end{array}\right\} \quad (1)$$

The simplest method for creating transfer functions corresponds to creating three tables each having a 256×256×256 three-dimensional arrangement as shown in Equation (2) if the independent component images each have a luminance specified by 256 gradations.

$$\left.\begin{array}{l} R\ [256, 256, 256] \\ G\ [256, 256, 256] \\ B\ [256, 256, 256] \end{array}\right\} \quad (2)$$

That is, 16.7 million values must be defined for each table but cannot actually be defined easily. According to the present invention, N training sample points are selected on a three-dimensional space specified by s1, s2, and s3 and associated with the color components, while values are determined for the other points using smooth transfer functions determined from the training sample.

Color components that are associated with the N points can be selected in such a manner that a human operator determines the white matter in the brains to be expressed in cream and the gray matter, in pink, but the Visible Human Dataset (http://www.nlm.nih.gov/research/visible/visible_human.html) issued by the National Library of Medicine in the U.S. can be used for automatic creation. This dataset contains three MRI images and sectional color images of a cadaver and can thus be used to easily associate the independent components of MRI with the color components thereof.

A neural network approach can be used to generate smooth transfer functions that reproduce these points as faithfully as possible. That is, the network is caused to learn the training sample so that the trained network can be used as transfer functions.

The transfer functions created from the Visible Human Dataset can always be used if the objective is to simply create sectional color images. However, for special coloring for diagnosis such as the emphasis of a cancer site in red or display of fat in green, a training sample must be provided where the luminance and color component of the cancer site in each independent component are associated with each other.

5. For an object for which colored MRI is to be generated, M' (M'≧L) channels of MRI images are scanned while varying the conditions.

6. The image data in the above 5 are subjected to a second independent component analysis to generate L independent component images similar to those in the above 2.

7. A process (calibration) is carried out for matching a luminance scale for the independent-component images in the above 6 with that for the independent-component images in the above 2.

Figure 6:
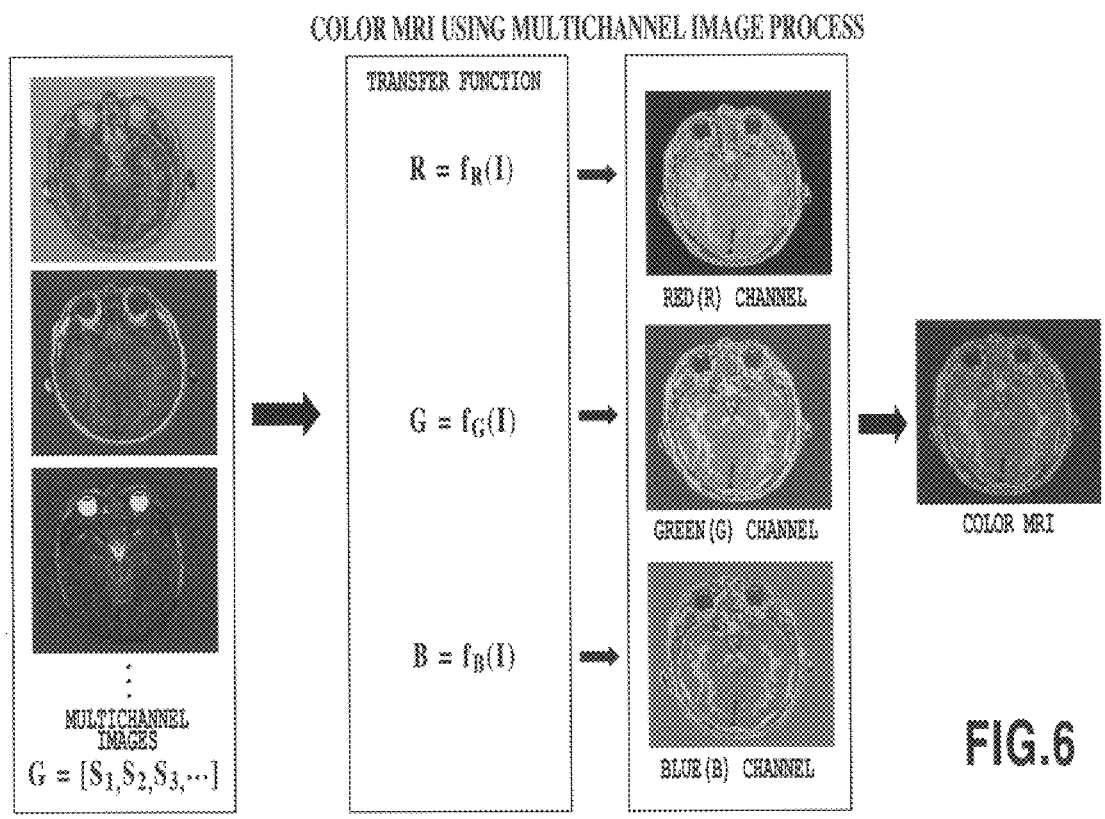
FIG. 6 is a view useful in explaining colored MRI based on a multichannel image process.

8. The transfer functions obtained by means of the process in the above 4 are applied to the independent-component images obtained through the calibration executed by means of the process in the above 7, thereby obtaining a color image (see FIG. 6).

This coloring allows the luminance information for the multichannel MRI to be integrated into a single color image to thereby solve the problem i. of the prior art. The three-channel MRI (T1 weighted, T2 weighted, and proton weighted) of a cadaver provided by the Vsible Human Dataset issued by the National Library of Medicine in the U.S. are suitable for creating the training sample in the processing 1, 2, and 3, as described above. Alternatively, a combination of multichannel MRI and color images of a tissue sample is also preferable, and an artificial sample intended to associate a particular tissue with a particular color is also suitable.

Figure 4:
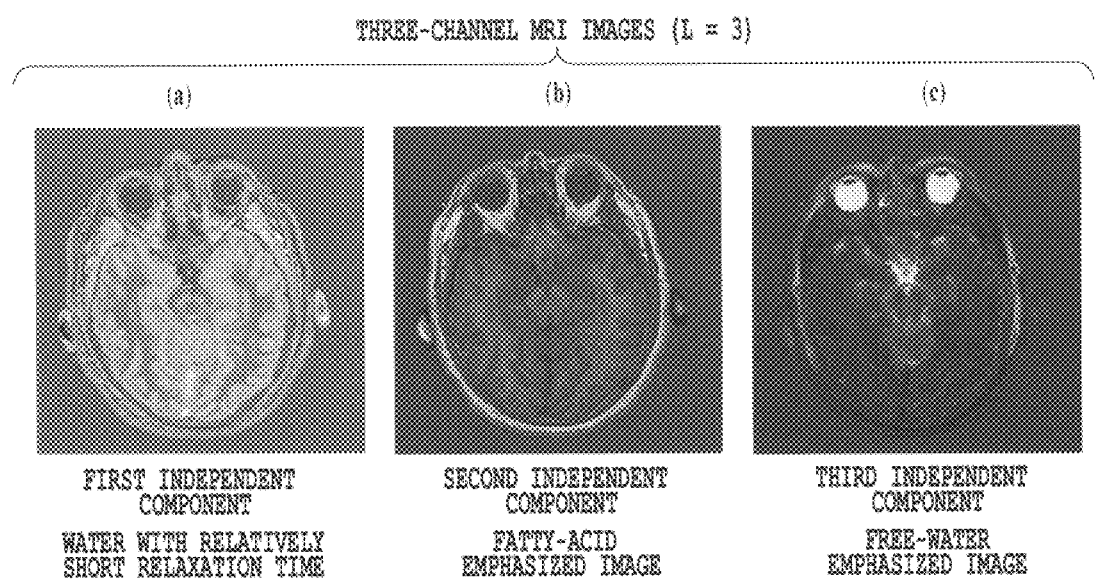
FIG. 4 is a view useful in explaining an independent component analysis.

The independent component analysis used in the processing 2 and 6 is a signal processing method for determining a signal source from a mixed signal. When this processing method is applied to the three-channel MRI data in FIG. 1, independent component images such as those shown in FIG. 4, which reflect physical differences, can be generated. The generated independent components are unlikely to be affected by differences among independent component images such as those between the TR and TE or by those among MRI devices. Thus, when the independent component images shown in FIG. 4 are used as references for coloring, the problems ii. of the prior art are solved.

The generation of the transfer functions in the processing 4 equals smooth interpolation of a training sample comprising N points in an L-dimensional space. There are various possible methods for generating such smooth functions from a training sample of N points, but the radial basis function method (RBF) is effective. The use of the RBF solves the problem iii. of the prior art. The details of the RBF will be shown in the supplementary description. The transfer functions as used herein include those as directly output independent component images (because skilled doctors prefers displays using such transfer functions).

PREFERRED EMBODIMENTS

A. Implementation with software

Figure 7:
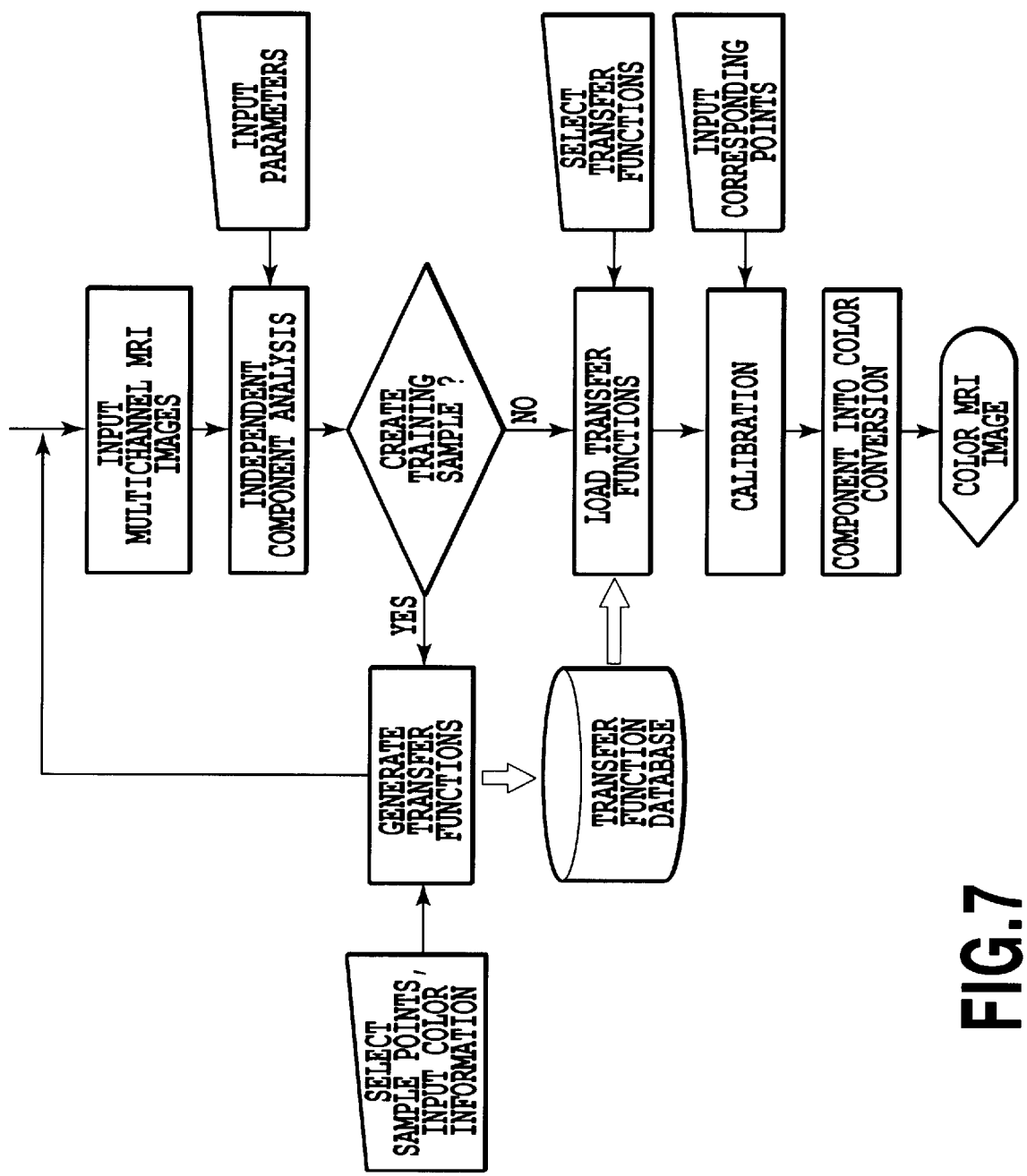
FIG. 7 is a view illustrating a procedure for implementing the colored MRI using software.

FIG. 7 shows a procedure for executing the above process using software on a general purpose computer. A multichannel MRI data input is subjected to an independent component analysis. This parameter input includes the size of MRI images, the number of channels (M or M'), the number of independent components (L), the type of data (whether or not they constitute a training sample), and others. The details of the independent component analysis will be shown in the supplementary description.

If a training sample is to be generated, data such as the Visible Human Dataset which provide a set of multichannel MRI and color sectional images can be used to automatically generate transfer functions that generate tissue colors. If, however, special coloring that meets the user's objects is to be executed, independent components and color information must be manually input.

If no training sample is generated, the coloring process is assumed to be executed and MRI images that have been subjected to the independent component analysis are transmitted to a transfer function selecting section. An appropriate transfer function is selected from a database for use depending on what coloring is to be executed. Since each of the independent components of a training sample and a corresponding one of the independent components of multichannel MRI data to be colored differ from each other, the luminance of each of the independent component images of the training sample and that of the corresponding one of the independent component images of the data to be colored must be associated with each other. This process can be automated by imaging several substance samples with different MRI luminances such as water and oil so that they are contained both in the training sample and in the data to be colored and determining such conversion that these substances have equal luminances between the corresponding independent components images of both data. Without such an automation, the tissues must be manually associated with each other.

FIGS. 8A to 8C show an example of calibration where multichannel MRI of a healthy volunteer is colored using the Visible Human Dataset as a training sample. In the illustrated sample, an image processing method called "clustering" is used to divide each independent component of the training sample and of the healthy volunteer into six areas. Two of these areas of the training sample such as the eyes and the background which can be easily distinguished from the other areas are associated with the two corresponding areas in the healthy volunteer, and linear calibration functions are generated to convert the luminance scale for the independent components of the healthy volunteer into that for the independent components of the training sample.

Transfer functions are then applied to the independent components having their scales corrected with these calibration functions, to enable a colored MRI image to be generated.

B. Implementation with Hardware

Figure 9:
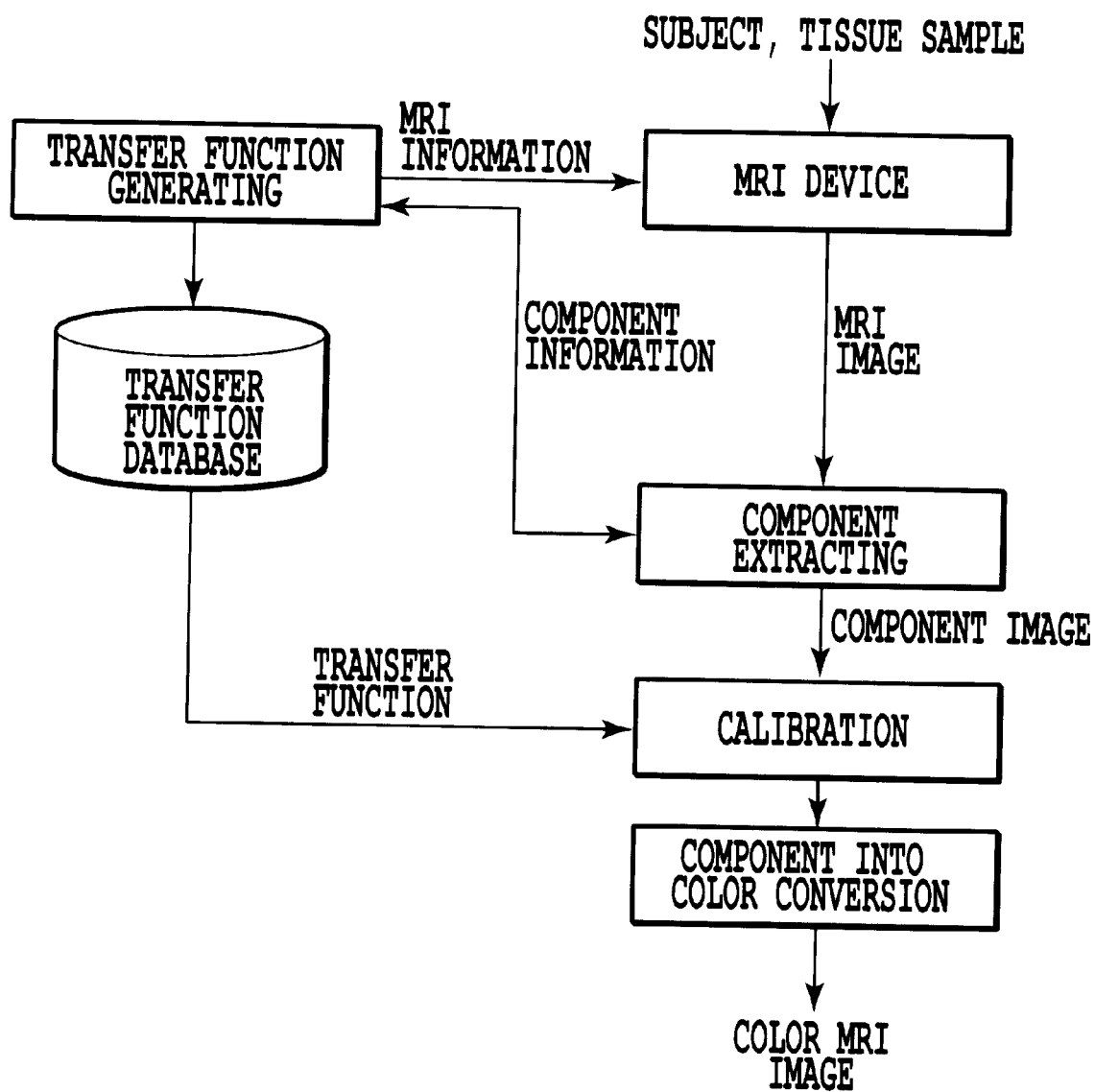
FIG. 9 is a view illustrating a configuration in which the colored MRI is implemented using hardware.

Hardware for carrying out the above process has a configuration such as that shown in FIG. 9. The other components of the MRI device can be implemented using a digital computer. The hardware operates integrally with the MRI device, and a component extracting section subjects the multichannel MRI of a subject or a tissue sample to the independent component analysis. A transfer function generating section generates transfer functions from a training sample and stores them in a transfer function database. A calibration section selects a transfer function from the transfer function generating section and matches a scale for the independent components of an object to be colored with that for the independent components of the transfer function. A converting component section into color applies transfer functions to the calibrated independent components to generate a color image.

(Supplementary Description)

A. Independent Component Analysis of Multichannel MRI

Figure 10:
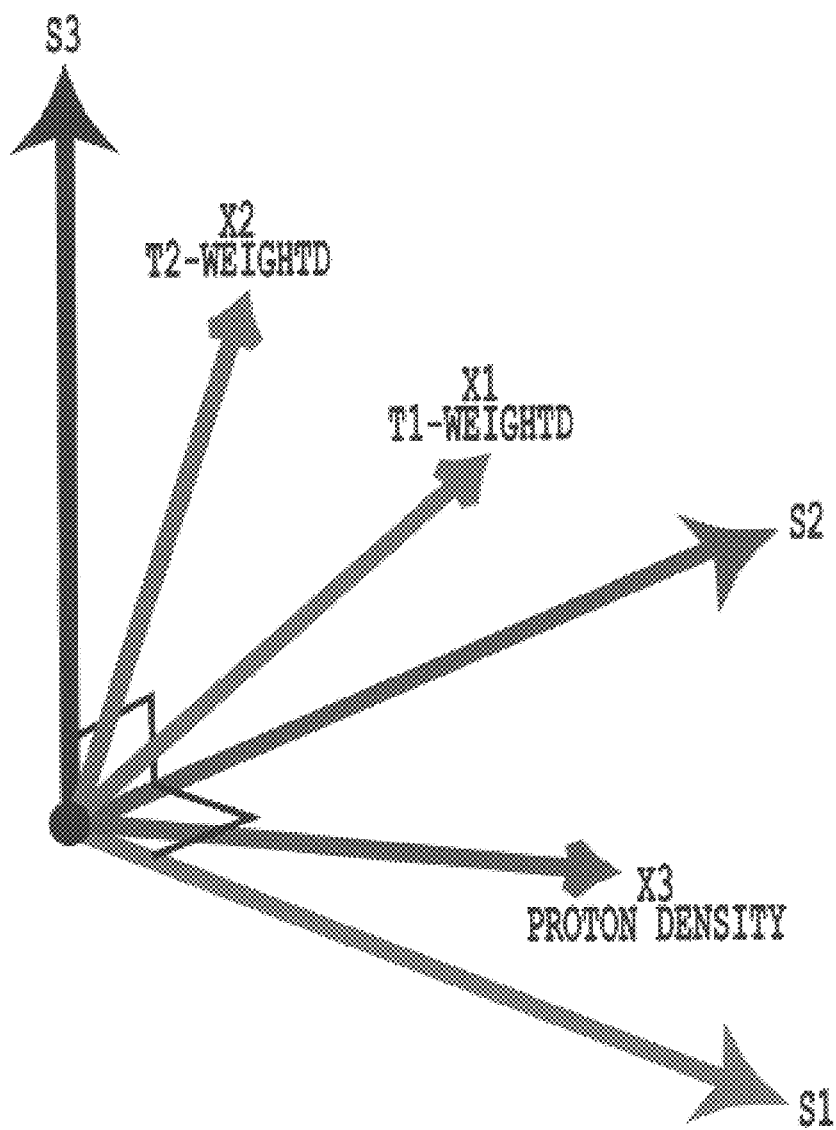
FIG. 10 is a view useful in explaining independent component analysis for the multichannel MRI.

If M-channel MRI data obtained under different imaging conditions are expressed by Equation (3), then in the independent component analysis (ICA), the MRI data X are assumed to be observed as a linear combination of M independent source signals S expressed by Equation (4) (see FIG. 10). That is, the following equations are given:

$$X=[x_1, \ldots, x_M]^T \quad (3)$$

$$S=[s_1, \ldots, s_M]^T \quad (4)$$

and the MRI data are expressed by a linear combination shown by Equation (5).

$$X=AS \quad (5)$$

In this case, $x_m$ is assumed to have been converted in such a manner that its average value is zero. The independent component analysis (ICA) can be considered to be a problem that determines such M×M matrices A and S that the individual elements of the source signal are as independent of one another as possible. Since it is actually difficult to simultaneously determine A and S, an appropriate M×M matrix W is first defined and Equation 6 is then calculated.

$$Y=[y_1, \ldots, y_M]^T=WX \quad (6)$$

W is sequentially modified so that the elements of Y are as independent of one another as possible. Once this calculation has converged, Y is assumed to match S except for its scale and sequence.

Many methods for making elements yi independent of one another have been proposed, and it is known that in any of these cases, W may be modified as shown in Equation (8), in accordance with a natural gradient $\nabla W$ expressed by Equation (7). In Equation (8), η denotes an appropriate learning function.

$$\nabla W=\{I-\phi(Y)Y^T\}W \quad (7)$$

$$W=W+\eta\nabla W \quad (8)$$

φ(Y) in Equation (7) is expressed by Equation (9).

$$\phi(Y)=[\phi_1(y_1), \ldots, \phi_M(y_M)]^T \quad (9)$$

This φ(Y) is a cumulative density function of fi in a mathematical sense. The probability density function of the source, however, cannot be determined beforehand, so that a non-linear function φi(yi) such as that expressed by Equation (10) is used.

$$\varphi_i(y_i) = \overline{2\tan h(y_i)} \quad (10)$$

The above description is based on the assumption that the number of components in observation data X and the number of components in source data S are both M. Alternatively, the data X are subjected to a principal component analysis, so that only significant components can be used to determine data S having components the number of which is smaller than M.

B. Generation of Transfer Functions Using Radial Basis Function Method

A problem that generates transfer functions from a training sample comprising a set of M independent components S(tn)=[s1(tn), . . . , sM(tn)] and color components C(tn)= [c1(tn), c2 (tn), c3 (tn)] can be considered to determine a smooth function fj(S) such as Equation (11). In this equation, tn (n=1, . . . , N) is an index to voxels carried as the training sample.

$$c_1(t_n) \approx f_1(S(t_n)), \quad (11)$$
$$c_2(t_n) \approx f_2(S(t_n)),$$
$$c_3(t_n) \approx f_3(S(t_n)),$$

A function such as Equation (11) is generated using the radial basis function (RBF) method.

According to the RBF method, a smooth function fj(S) is defined using Equation (12) representing a linear combination of p radial basic functions φp(S).

$$f_j(S) = \sum_{p=1}^{P} \omega_{j,p}\phi_p(S) \quad (12)$$

Here, S=[s1, . . . , sM] denotes an M-dimensional vector, and wj and p denote weight functions. Various basic functions φp(S) can be used, but the product of Gaussian functions is generally used. Once the basic function has been determined, the training sample can be used to determine the weight functions wj and p. That is, the following equations are given:

$$\Omega_j = [\omega_{j,1}, \ldots, \omega_{j,P}], \quad (13)$$

$$\phi(S) = ([\phi_1(S), \ldots, \phi_P(S)])^T, \quad (14)$$

and fj(S) is expressed using a vector expression such as Equation (15). Then, Equation (16) is solved to determine a vector Ωj that minimizes Ej expressed using Equation (17).

$$f_j(S)=\Omega_j\phi(S) \quad (15)$$

$$E_j = \sum_{n=1}^{N} \|f_j(S(t_n)) - c_j(t_n)\|^2 \quad (16)$$

$$\Omega_j^T=\Phi^*T_j \quad (17)$$

Here, when Tj is denoted by Equation (18) and (Φ)np is denoted by Equation (19), Φ* is a pseudo inverse matrix of an N×P matrix Φ.

$$T_j=[C_j(t_1), \ldots, c_j(t_N)]^T \quad (18)$$

$$(\Phi)_{np}=\phi_p(S(t_n)), \quad (19)$$

The applicant places p basic functions φp(S) on a lattice in an M-dimensional space defined by S. When onedimensional Gaussian functions are expressed by Equation (20), the product of these functions is defined by φp(S).

$$\phi_{m,k}(s_m) = \exp\left\{-\frac{(s_m - g_{m,k})^2}{2\sigma_{m,k}^2}\right\} \quad (20)$$

Figure 11:
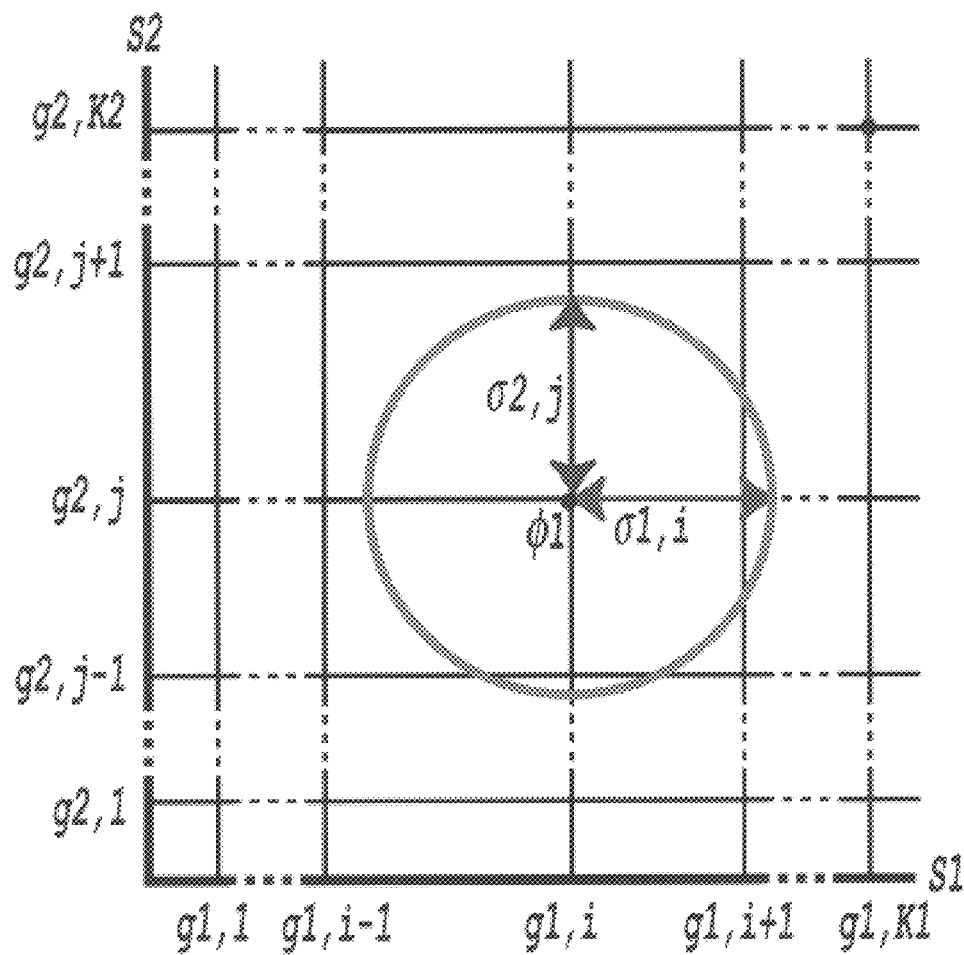
FIG. 11 is a view useful in explaining generation of a transfer function based on the radial basis function method.

That is, in the case of two dimensions (M=2), a function such as Equation (21) is arranged as shown in FIG. 11.

$$\phi_p(S) = \phi_{K1 \cdot j+i}(S) = \phi_{1,i}(s_1)\phi_{2,j}(s_2) \quad (21)$$

In this case, K1 and K2 denote the numbers of classes obtained when each independent component is subjected to area classification (clustering) using the k-mean method, and P=K1*K2. Similarly, for M=3, Equation (22) is established and P=K1*K2*K3.

$$\phi_l(S) = \phi_{K2(K1 \cdot k+j)+i}(S) = \phi_{1,i}(s_1)\phi_{2,j}(s_2)\phi_{3,k}(s_3) \quad (22)$$

The symbol gm, k in Equation (20) denotes a cluster center of each independent component subjected to area classification. The symbol am, k is such a value as shown in Equation (23). In this equation, λ denotes an appropriate constant.

$$\sigma_{m,k} = \lambda(g_{m,k+1} + g_{m,k-1})/2 \quad (23)$$

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A coloring method for executing a multichannel MRI imaging, the method comprising:

imaging a plurality of (M-channel) MRI images while varying conditions for a tissue sample for which colors can be determined and for which MRI imaging is possible;

subjecting data on said M-channel MRI images to a first independent component analysis (ICA) to decompose the images into L (L≦M) independent component images;

selecting N points on the sample to create a training sample that is a set of L independent component image luminances and color components;

using said training sample to generate as many transfer functions as the color components which output one color component for an arbitrary combination of the L independent component image luminances;

for an object for which colored MRI is to be generated, imaging M'-channel (M'≧L) MRI images while varying the conditions;

performing a second independent component analysis for the data on said M'-channel MRI images to generate L independent component images;

calibrating said second independent components so that said second independent components equal to those of said first independent component, and applying the transfer functions obtained using said training sample, to said calibrated independent component images to obtain a color image.

2. A coloring apparatus for executing a multichannel MRI image process, the apparatus comprising:

an MRI device for imaging a plurality of (M-channel) MRI images while varying conditions for a tissue sample for which colors can be determined and for which MRI imaging is possible, and for an object for which colored MRI is to be generated, further imaging M'-channel (M'≧L) MRI images while varying the conditions;

a component extracting section for subjecting data on the M-channel MRI images to an independent component analysis (ICA) to decompose the images into L (L≦M) independent component images, and further subjecting data on said M'-channel MRI images to an independent component analysis to generate L independent component images;

a transfer function generating section for selecting N points on the sample to create a training sample that is a set of L independent component image luminances and color components, and using this training sample to generate as many transfer functions as the color components which output one color component for an arbitrary combination of the L independent component image luminances;

a calibration section for selecting a transfer function from said transfer function generating section and calibrating independent components of the object to be colored so that their scale equals that for independent components of the transfer function; and a converting component section into color for applying the transfer functions to the calibrated independent component images to obtain a color image.

* * * * *